United States Patent
Kajiwara

(10) Patent No.: US 9,991,121 B2
(45) Date of Patent: Jun. 5, 2018

(54) METHOD OF MANUFACTURING SEMICONDUCTOR DEVICE

(71) Applicant: FUJI ELECTRIC CO., LTD., Kanagawa (JP)

(72) Inventor: Keiko Kajiwara, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days. days.

(21) Appl. No.: 15/276,722

(22) Filed: Sep. 26, 2016

(65) Prior Publication Data

US 2017/0133227 A1    May 11, 2017

(30) Foreign Application Priority Data

Nov. 10, 2015   (JP) ................ 2015-220664

(51) Int. Cl.
| | |
|---|---|
| H01L 21/00 | (2006.01) |
| H01L 21/266 | (2006.01) |
| H01L 21/265 | (2006.01) |
| H01L 21/306 | (2006.01) |
| H01L 29/66 | (2006.01) |

(52) U.S. Cl.
CPC ...... *H01L 21/266* (2013.01); *H01L 21/26513* (2013.01); *H01L 21/30625* (2013.01); *H01L 29/6609* (2013.01); *H01L 29/66325* (2013.01); *H01L 29/66477* (2013.01)

(58) Field of Classification Search
None
See application file for complete search history.

(56) References Cited

U.S. PATENT DOCUMENTS

| | | | |
|---|---|---|---|
| 6,875,659 B2 * | 4/2005 | Yang | ........... H01L 27/1126 257/E21.672 |
| 2003/0180633 A1 * | 9/2003 | Sato | ........... G03F 7/0035 430/5 |
| 2009/0114946 A1 | 5/2009 | Ueno | |

FOREIGN PATENT DOCUMENTS

| | | |
|---|---|---|
| JP | H05-283383 A | 10/1993 |
| JP | 2007-128974 A | 5/2007 |
| JP | 2009-266940 A | 11/2009 |

* cited by examiner

*Primary Examiner* — Reema Patel

(57) ABSTRACT

To improve accuracy and shielding capabilities of impurity implantation, a method of manufacturing a semiconductor device is provided, the method including forming a first photoresist on a front surface of a semiconductor substrate, the front surface being provided with a front surface structure, forming, on the first photoresist or below a rear surface of the semiconductor substrate, a second photoresist having opposite photo-curing properties from those of the first photoresist, and implanting impurities into the semiconductor substrate using as a mask the second photoresist, which has been subjected to patterning.

11 Claims, 6 Drawing Sheets

METHOD OF MANUFACTURING SEMICONDUCTOR DEVICE

The contents of the following Japanese patent application are incorporated herein by reference:
No. 2015-220664 filed in JP on Nov. 10, 2015.

BACKGROUND

1. Technical Field

The present invention relates to a method of manufacturing a semiconductor device.

2. Related Art

Conventionally, in a manufacturing process of a semiconductor device, N-type or P-type dopant has been implanted into the interior of a semiconductor substrate using a metal mask as a shielding mask. Also, a photoresist has been provided as a shielding mask on a front surface or a rear surface of a semiconductor substrate, and N-type or P-type dopants has been implanted into the interior of the semiconductor substrate (for example, refer to Patent Documents 1 and 2). In addition, it has been known that ions are implanted via an organic film for channeling prevention (for example, refer to Patent Document 3), and t a protective film is provided, that protects a front surface when a rear surface of a semiconductor substrate is polished (for example, refer to Patent Document 4).

PRIOR ART DOCUMENTS

Patent Document 1: Japanese Patent Application Publication No. 2007-128974
Patent Document 2: Japanese Patent Application Publication No. 2009-105265
Patent Document 3: Japanese Patent Application Publication No. 2009-266940
Patent Document 4: Japanese Patent Application Publication No. H05-283383

A metal mask is lower in processing accuracy and alignment accuracy as compared with a photoresist, and thus the metal mask is also lower in accuracy of the implantation of N-type or P-type dopant as compared with the photoresist. Meanwhile, in a case where the photoresist is used, there are cases in which it is difficult to form a photoresist having a sufficient thickness to shield N-type or P-type dopant.

SUMMARY (General disclosure of the invention) In an aspect of the present invention, a method of manufacturing a semiconductor device is provided. The method of manufacturing the semiconductor device may include forming a first photoresist on a front surface of a semiconductor substrate, forming a second photoresist on the first photoresist or below a rear surface of the semiconductor substrate, and implanting impurities into the semiconductor substrate using as a mask the second photoresist, which has been subjected to patterning. The front surface of the semiconductor substrate may be provided with a front surface structure. The second photoresist may have photo-curing properties opposite to those of the first photoresist.

The first photoresist may be a positive-type. The second photoresist may be a negative-type.

The thickness of the second photoresist may be greater than that of the first photoresist.

The second photoresist may be a negative-type photosensitive dry film.

The method of manufacturing the semiconductor device may further include removing the second photoresist after the implantation of the impurities, and removing the first photoresist after the removal of the second photoresist.

The second photoresist may be formed on the first photoresist in the formation of the second photoresist. The impurities may be implanted from the front surface of the semiconductor substrate in the implantation of the impurities.

The second photoresist may have a thickness which is more than twice an implantation depth of the impurities to be implanted into the semiconductor substrate.

The second photoresist may be formed below the rear surface of the semiconductor substrate in the formation of the second photoresist. The impurities may be implanted from the rear surface in the implantation of the impurities.

The method of manufacturing the semiconductor device may further include forming a protective film on the first photoresist and polishing the rear surface of the semiconductor substrate, and the formation of the protective film and the polishing of the rear surface of the semiconductor substrate may be performed after the formation of the first photoresist and before the formation of the second photoresist.

The second photoresist having at least a first thickness and a second thickness may be formed in the formation of the second photoresist. The second thickness may be greater than the first thickness. The impurities may be implanted into the semiconductor substrate via the first photoresist and the second photoresist having the first thickness in the implantation of the impurities. The implantation of the impurities into the semiconductor substrate may be shielded via the first photoresist and the second photoresist having the second thickness.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims. Also, all the combinations of the features described in the embodiments are not necessarily essential to means provided by aspects of the invention.

In the present specification, when a first layer is "on" a second layer, it means that the first layer is located closer to the front surface than the second layer is. Similarly, when the first layer is "below" the second layer, it means that the first layer is located closer to the rear surface than the second layer is. In the present specification, when the first layer is "on" or "below" the second layer, it includes a case in which the first layer is provided in contact with the second layer, and a case in which other layers are interposed between the first layer and the second layer. Also, a phrase that refers to a direction of "on" or "below", or the like shows a relative direction in the semiconductor substrate and the semiconductor device, and does not refer to an absolute direction relative to an outside reference plane such as the ground.

Figure 1:
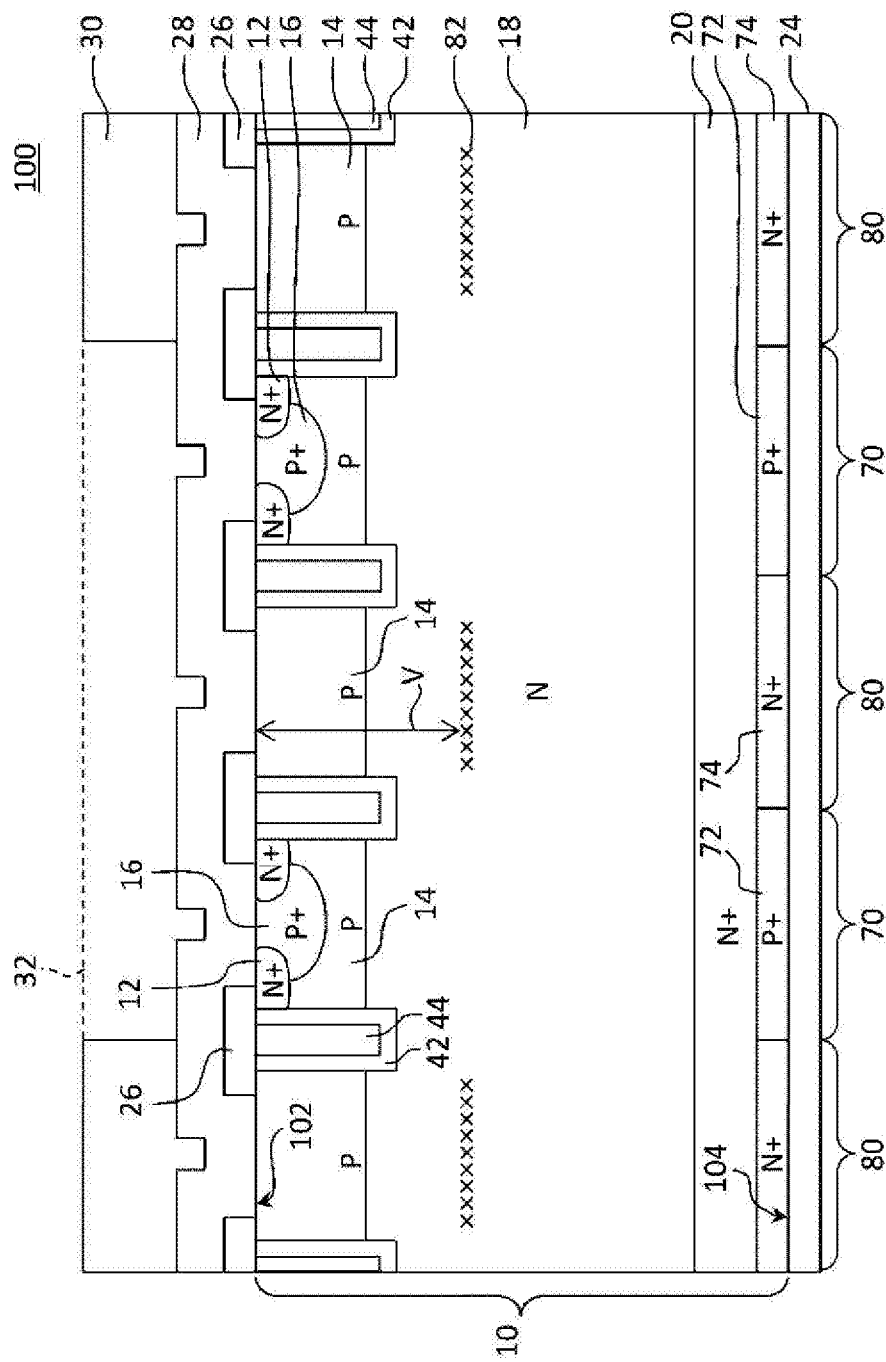
FIG. 1 is a cross-sectional view illustrating the summary of a semiconductor device 100.

FIG. 1 is a cross-sectional view illustrating the summary of a semiconductor device 100. The semiconductor device 100 may have one or more of an Insulated Gate Bipolar Transistor (IGBT), a Metal Oxide Semiconductor Field-Effect Transistor (MOSFET), and a diode. The semiconductor device 100 of the present example is a Reverse Conducting IGBT (RC-IGBT) having a transistor unit 70 with IGBT and a diode unit 80 in a single semiconductor substrate 10. In addition, the present example is an exemplary constitution of the semiconductor device 100, and the semiconductor device 100 may have a constitution other than the constitution shown herein.

The transistor unit 70 of the present example has the semiconductor substrate 10, a collector electrode 24, an emitter electrode 28, an insulating layer 26, and a passivation film 30. The semiconductor substrate 10 may be a silicon substrate, and it may also be a compound semiconductor substrate of a silicon carbide substrate and nitride semiconductor substrate, and the like. The collector electrode 24 is formed in contact with a rear surface 104 of the semiconductor substrate 10. The emitter electrode 28 is formed in contact with a front surface 102 of the semiconductor substrate 10. The collector electrode 24 and the emitter electrode 28 are formed of conductive materials of metals or the like. The collector electrode 24 and the emitter electrode 28 of the present example are formed of aluminum.

The passivation film 30 is formed on the emitter electrode 28. The passivation film 30 is formed of insulating materials of polyimide or the like. The passivation film 30 may have an opening 32. A portion of the emitter electrode 28 is exposed through the opening 32.

An emitter region 12 is selectively formed in a portion of the region on the side of the front surface 102 of the semiconductor substrate 10 in the transistor unit 70. The emitter region 12 has a first conductivity-type, and it is connected to the emitter electrode 28. A base region 14 has a second conductivity-type which is different from the first conductivity-type. The base region 14 is located below the emitter region 12. In the present example, the first conductivity-type and the second conductivity-type will be described as N-type and P-type, respectively. In other examples, however, the first conductivity-type may be P-type, and the second conductivity-type may be and N-type.

In a base region 14, a channel is formed along a depth direction, according to voltage applied to a gate electrode 44. A contact region 16 is a second conductivity-type, and it is located closer to the front surface 102 than the base region 14 is. In addition, a portion of the contact region 16 is exposed on the front surface 102 of the semiconductor substrate 10, and it is connected to the emitter electrode 28.

An insulating film 42 is provided covering the interior of a trench provided on the side of the front surface 102 of the semiconductor substrate 10. The gate electrode 44 is formed in contact with the insulating film 42 in the interior of the trench. The insulating film 42 insulates the gate electrode 44 and the semiconductor substrate 10 from each other. The gate electrode 44 may be formed of conductive materials of polysilicon, or the like.

In the transistor unit 70 of the present example, the semiconductor substrate 10 further has a first conductivity-type drift layer 18, a first conductivity-type buffer layer 20, and a second conductivity-type collector layer 72. The drift layer 18 is provided below the base region 14.

The buffer layer 20 is formed below the drift layer 18. N-type concentration of the buffer layer 20 is higher as compared with N-type concentration of the drift layer 18. The buffer layer 20 may serve as a field stop layer that prevents a depletion layer spreading from the underside of the base region 14 from reaching the collector layer 72. The collector layer 72 is formed below the buffer layer 20 in the transistor unit 70. Also, the rear surface of the collector layer 72 contacts the collector electrode 24.

In the present example, the drift layer 18 is N-type. The emitter region 12 is $N^+$-type, and the base region 14 is P-type, and the contact region 16 is $P^+$-type. The buffer layer 20 is $N^+$-type, and the collector layer 72 is $P^+$-type. In addition, in the present specification, the letters "N" and "P" respectively mean that the electrons and holes are majority carriers. Also, regarding the superscript "+" or "−" added right to the letter "N" or "P", "+" indicates a higher carrier concentration when added than when not added, and "−" indicates a lower carrier concentration when added than when not added.

The diode unit 80 is provided in a region adjacent to the transistor unit 70. In the present example, the transistor units 70 and the diode units 80 are provided alternately. However, a plurality of the transistor units 70 and one diode unit 80 may be provided alternately.

The diode unit 80 has the base region 14, the drift layer 18, and the buffer layer 20, which are the same as the corresponding region and the layers of the transistor unit 70. In the diode unit 80, the base region 14 serves as an anode region. A cathode layer 74 is provided below the buffer layer 20 of the diode unit 80. The cathode layer 74 is a first conductivity-type, and in the present example, it is $N^+$-type. In the present example, the emitter region 12 and the contact region 16 are not formed in the base region 14 of the diode unit 80.

In the semiconductor substrate 10, a crystal defect region 82 formed by implanting impurities may be formed. In the present example, the crystal defect region 82 is formed only in the drift layer 18 of the diode unit 80, and it is not formed in the region of the transistor unit 70. In other examples, however, the crystal defect region 82 may be formed in the drift layer 18 and the buffer layer 20 of the transistor unit 70. A process of forming the crystal defect region 82 in the diode unit 80 only will be described in detail in FIG. 2 or later.

In the present example, the crystal defect region 82 acts as a lifetime killer in the diode unit 80. The lifetime killer controls carrier lifetime in the drift layer 18 within a predetermined range. Specifically, in a case where the lifetime killer is present, the carrier lifetime can be reduced as compared with the case where the lifetime killer is not present. By controlling the carrier lifetime, reverse recovery time in the diode unit 80 can be reduced. Meanwhile, in the transistor unit 70 of the present example, the crystal defect region 82 supposed to be formed by impurity implantation is not formed, thereby making it possible to suppress electric effects by crystal defect.

In a case where impurities are implanted from the front surface 102 of the semiconductor substrate 10, depth from the front surface 102 of the semiconductor substrate 10 to a peak part of the crystal defect region 82 is impurity implantation depth V, as shown in FIG. 1. Meanwhile, in a case where the impurities are implanted from the rear surface 104 of the semiconductor substrate 10, depth from the rear surface 104 of the semiconductor substrate 10 to a peak part of the crystal defect region 82 is impurity implantation depth. The impurity implantation depth V may be set such that the crystal defect region 82 is positioned in the vicinity of a p-n junction which is a boundary between the base region 14 (serving as the anode region in the diode unit 80) and the drift layer 18.

In addition, "impurities" mean, for example, ion of helium ion, heavy hydrogen ion, and proton, and the like, which are used for the purpose of introducing, into the semiconductor substrate, defects serving as the lifetime killer. In the present example, "impurities" do not mean phosphorous (P) or boron (B), or the like, which are introduced, into the semiconductor substrate, for the purpose of adding N-type or P-type to the semiconductor substrate.

Figure 2:
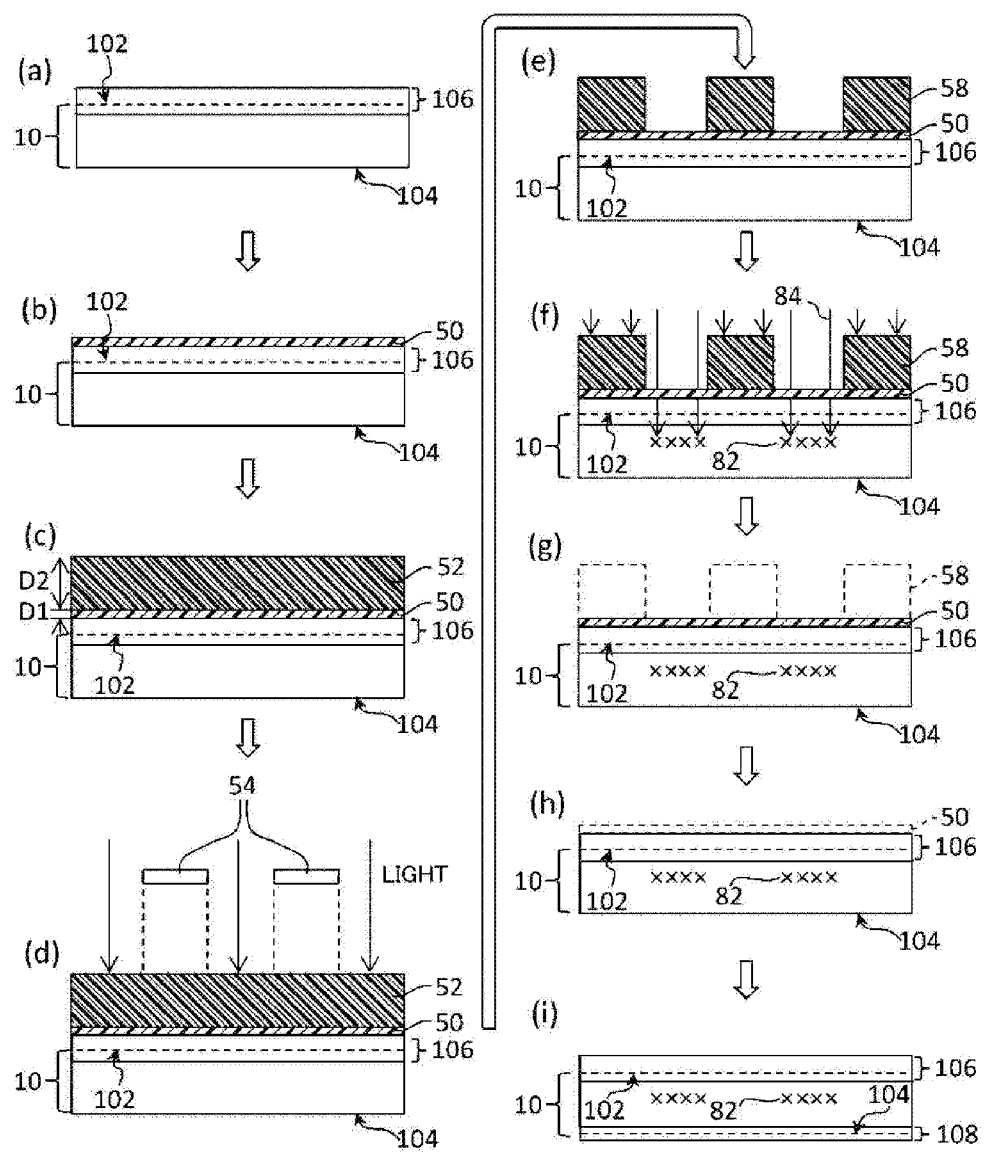
FIG. 2 is a cross-sectional schematic view illustrating a semiconductor device manufacturing process in a first embodiment.

FIG. 2 is a cross-sectional schematic view illustrating a semiconductor device manufacturing process in the first embodiment. In step (a) of FIG. 2, a front surface structure 106 is formed on the front surface 102 of the semiconductor substrate 10. The front surface structure 106 includes, for example, the passivation film 30, the emitter electrode 28, the insulating layer 26, the emitter region 12, the contact region 16, the base region 14, the gate electrode 44, and the insulating film 42 of FIG. 1. However, the constitution included in the front surface structure 106 may be different depending on the type of the semiconductor device 100. In a case where the semiconductor device 100 includes a transistor, the front surface structure 106 may be a structure including the gate electrode 44. In FIG. 2, details of the front surface structure 106 are omitted.

The semiconductor substrate 10 of the present example has already been polished to the thickness of a final product. The thickness of the semiconductor substrate 10 is determined by target breakdown voltage of the semiconductor device 100. The thickness of the semiconductor substrate 10 may be 60 µm or more, and 120 µm or less.

Next, in step (b) of FIG. 2, a first photoresist 50 is formed on the front surface 102 of the semiconductor substrate 10. In the present example, the first photoresist 50 is formed on the front surface structure 106. The first photoresist 50 is used as a protective film of the front surface structure 106. The first photoresist 50 may be coated by a spin coating method. The first photoresist 50 may be heat-cured as a pre-bake process, after being coated.

The first photoresist 50 of the present example is a positive-type photoresist. The positive-type photoresist has properties in which solubility with a developing solution increases upon exposure.

As the positive-type photoresist of the present example, photoresists based on vinyl cinnamate, cyclized polyisobutylene, azo-novolac resin, and diazoketone-novolac resin and the like are given. However, the type of the positive-type photoresist is not particularly limited as long as it can be stripped without causing damage to the front surface structure 106 in stripping the first photoresist 50, which will be described later, and as long as it would not be stripped by an stripping solution used for a second photoresist pattern (photosensitive dry film pattern), which will be described later.

It is difficult to form the positive-type photoresist thicker as compared with the negative-type photoresist due to sensitivity to light and heat resistance. The thickness of the first photoresist 50 of the present example is 50 µm or less.

Next, in step (c) of FIG. 2, a second photoresist 52 having photo-curing properties opposite to those of the first photoresist 50 is formed on and in contact with the first photoresist 50. Thickness D2 of the second photoresist 52 may be greater than thickness D1 of the first photoresist 50.

Thickness D2 of the second photoresist 52 has a thickness capable of shielding impurities. Meanwhile, thickness D1 of the first photoresist 50 has a thickness which does not shield impurities. The thickness to make the second photoresist 52 serve as a shielding mask for the impurities is determined by a range of the implanted impurities within the second photoresist 52 and a range of the implanted impurities within the semiconductor substrate. The range means a distance traveled by charged particles after entering materials until they stop.

In a case where it is assumed that the range, of the impurities to be implanted, in the second photoresist 52 is twice as much as the range of the same in the semiconductor substrate 10, thickness D2 of the second photoresist 52 may have a thickness which is more than twice implantation depth V of the impurities to be implanted into the semiconductor substrate 10. Thereby, it is possible to prevent the impurities from being implanted into a region where the impurity implantation is not necessary.

The second photoresist 52 may be a negative-type photoresist. In particular, in the present example, the second photoresist 52 is a negative-type photosensitive dry film. The second photoresist 52 is attached onto the first photoresist 50.

The negative-type photosensitive dry film may have a structure in which a photo-curing resin layer is supported by a support film. The photo-curing resin layer may have a film thickness of 30 µm or more and 200 µm or less. In the present example, the photo-curing resin layer is formed of a negative-type resist composition material. When the second photoresist 52 is attached onto the first photoresist 50, the support film may be removed.

The negative-type photoresist has properties in which solubility in a developing solution decreases upon exposure. The negative-type photoresist includes but not particularly limited to materials of, for example, azide-cyclized polyisoprene, azide-phenolic resin, chloromethyl polystyrene, and acrylic resin, and the like. The photosensitive dry film can be thickened more easily as compared with the case where the photoresist is coated by the spin coating method.

The spin coating method needs equipment, and also needs drug solution management. Meanwhile, in a case where the photosensitive dry film is used, the drug solution management is not necessary. Also, in the spin coating method, even if the photoresist is overcoated plural times, the film thickness of the photoresist would not increase in direct proportion to the number of times overcoating is performed. Meanwhile, in a case where the photosensitive dry film is used, the second photoresist 52 having a greater thickness can be formed by overlaying a plurality of the photosensitive dry films as necessary, and thus it is easy to control the film thickness.

Unlike the present example, the negative-type photoresist can be formed as the second photoresist 52 by the spin coating method. In this case, the negative-type photoresist can also be formed thicker easily as compared with the positive-type photoresist. For example, the second photoresist 52 can be formed to be 10 µm or more and 100 µm or less in thickness.

In step (d) of FIG. 2, a portion of the region of the second photoresist 52 is exposed in order to apply patterning on the second photoresist 52. In the present example, the second photoresist 52 on the transistor unit 70 which is a region where the impurities are not implanted needs remain after development. Therefore, the second photoresist 52 on the transistor unit 70 is exposed. Meanwhile, the second photoresist 52 on the diode unit 80 which is a region where the impurities are implanted needs to be removed after development, and thus the second photoresist 52 on the diode unit 80 shields light by a resist mask 54, and it is not exposed. The exposure may be performed using a lens stepper system, a proximity system, or a mirror projection system.

The second photoresist 52 can be subjected to fine processing to the same degree of as the film thickness, and thus a minimum processing dimension has the same width as the film thickness. For example, in a case where the thickness of the second photoresist 52 is 50 µm, the minimum processing dimension is 50 µm. Meanwhile, mechanical processes are interposed in the metal mask, and thus the minimum processing dimension is approximately 300 µm. Therefore, the use of the second photoresist 52 results in a higher processing accuracy as compared with the case where the metal mask is used.

An exposure system used in a pre-process of the semiconductor can be used, and thus, alignment accuracy of the second photoresist 52 is higher as compared with that of the metal mask. In the present example, the alignment accuracy of the photosensitive dry film is ±1 µm. Meanwhile, the alignment accuracy between the metal mask and the pattern on the semiconductor substrate 10 is approximately ±100 µm when manually adjusted, and it is also approximately ±50 µm when automatically adjusted. Therefore, the alignment accuracy in a case where the second photoresist 52 is used becomes higher as compared with the alignment accuracy in a case where the metal mask is used.

As mentioned above, the processing accuracy and the alignment accuracy in a case where the second photoresist 52 is used can be increased as compared with the case where the metal mask is used. Therefore, a margin at the time of device design can be decreased, and a number of semiconductor chips capable of being produced per a single sheet of the semiconductor substrate 10 can be increased.

In step (e) of FIG. 2, an unexposed part of the second photoresist 52 is dissolved using a developing solution of organic solvent which is a developing solution for the negative-type photoresist. Thereby, the second photoresist 52 is developed. A second photoresist pattern 58 which is the second photoresist 52 subjected to patterning is formed through the exposure step in step (d) of FIG. 2 and the development step in step (e) of FIG. 2. The first photoresist 50 has already been heat-cured, and thus it does not substantially dissolve into the developing solution for the negative-type photoresist.

As the developing solution for the negative-type photoresist, it is possible to use a developing solution containing, as components, one or more substances selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl pentanoate, methyl pentenoate, methyl crotonate, ethyl crotonate, methyl lactate, ethyl lactate, propyl lactate, butyl lactate, isobutyl lactate, amyl lactate, isoamyl lactate, 2-hydroxyisobutyric acid methyl ester, 2-hydroxyisobutyric acid ethyl ester, methyl benzoate, ethyl benzoate, benzyl acetate, methyl phenylacetate, benzyl formate, phenylethyl formate, 3-phenylpropionic acid methyl ester, benzyl propionate, ethyl phenylacetate, 2-phenylethyl acetate, sodium carbonate, and anhydrous sodium carbonate. However, the type of the developing solution for the negative-type photoresist is not particularly limited, and it is possible to use any type as long as it does not dissolve the first photoresist 50 which is the positive-type photoresist.

After development, the second photoresist pattern 58 may be subjected to a post-bake process. Resistance of the second photoresist pattern 58 to the impurity implantation carried out after finishing a photolithography process increases by heating the second photoresist pattern 58 in the post-bake process.

In step (f) of FIG. 2, impurities 84 are implanted into the semiconductor substrate 10 using the second photoresist pattern 58 as a mask. In the present example, the impurities 84 are implanted from the front surface 102 of the semiconductor substrate 10. Therefore, a defect generation position from the front surface 102 can be controlled. In the present example, helium ion is implanted as the impurities 84. As described above, however, the impurities 84 may be proton or heavy hydrogen ion, or the like.

In the present example, an ion implantation apparatus implants the impurities 84 into the semiconductor substrate 10 by an ion implantation method. Accelerating voltage at the time of ion implantation is adjusted such that implantation depth V of the impurities to be implanted into the semiconductor substrate 10 reaches a predetermined depth.

In a target region where the crystal defect region 82 is caused, that is, the diode unit 80, the impurities 84 injected from the ion implantation apparatus are implanted into the semiconductor substrate 10, penetrating the first photoresist 50 and the front surface structure 106. The implanted impurities 84 remain in the drift layer 18 of the semiconductor substrate 10. Thereby, the crystal defect region 82 is formed in the position of implantation depth V.

In the present example, the film of the second photoresist pattern 58 is thickened as compared with that of the first photoresist 50, and thus, the second photoresist pattern 58 can also provide sufficient shielding in a case where the impurities are implanted into a deep part of the semiconductor substrate 10. In particular, the second photoresist pattern 58 has thickness which is more than twice implantation depth V of the impurities to be implanted into the semiconductor substrate 10, and thus it can prevent the impurities from being implanted into a region where the impurity implantation is not necessary.

Next, as shown in step (g) of FIG. 2, the second photoresist pattern 58 is removed after the step of implanting impurities (step (f) of FIG. 2). The second photoresist pattern 58 is removed using a stripping solution for the negative-type photoresist. In addition, the first photoresist 50 is heat-cured, and thus it does not substantially dissolve into the stripping solution for the negative-type photoresist.

As the stripping solution for the negative-type photoresist, for example, an amine-based stripping solution containing, mono ethanol amine or tetramethylammonium hydroxide is given. An alkaline aqueous solution containing sodium hydroxide or tetramethylammonium hydroxide (TMAH) is given. However, the type of the stripping solution is not limited, and it is possible to use any type as long as it does not remove the first photoresist 50 simultaneously when the second photoresist pattern 58 is removed.

Many types of the negative-type photoresist stripping solution is strong alkaline, and it is stronger than the positive-type photoresist stripping solution. In a case where there is no first photoresist 50 which is the positive-type photoresist, the stripping solution of the negative-type photoresist could damage insulating materials such as polyimide used for the passivation film 30 and a metal wiring such as an aluminum wiring used for the emitter electrode 28. In the present example, however, the first photoresist 50 is formed below the second photoresist pattern 58. Thereby, it is possible to prevent the stripping solution for the negative-type photoresist from directly contacting the front surface structure 106, when the second photoresist pattern 58 is removed.

Therefore, it is possible to prevent effects of the stripping solution for the negative-type photoresist on the front surface structure 106. As mentioned above, in the present example, the first photoresist 50 is taken as the positive-type, and the second photoresist 52 is taken as the negative-type. Therefore, in the impurity implantation by which the defect is generated, it is possible to prevent damage to the semiconductor device structure at the time of resist removal.

Next, as shown in step (h) of FIG. 2, in the present example, the first photoresist 50 is removed after the step of removing the second photoresist pattern 58 (step (g) of FIG. 2). The first photoresist 50 is removed using the stripping solution for the positive-type photoresist.

The stripping solution for the positive-type photoresist can be generally categorized into an organic-based resist stripping solution containing as main components aqueous amine such as alkanolamine, and a water-based resist stripping solution containing as main components water, in which organic alkaline and a fluorine-based compound are blended. For example, as the stripping solution for the positive-type photoresist, a composition composed of alkanolamine, polar solvent, and water is given. However, the type of the stripping solution for the positive-type photoresist is not limited to the above, and it is possible to use any type as long as it has less effect on the front surface structure 106 as compared with the case where the stripping solution of the second photoresist pattern 58 is used.

The stripping solution for the positive-type photoresist is alkaline, and it is weaker as compared with the stripping solution for the negative-type photoresist. Therefore, it is possible to reduce effects on the front surface structure 106 of the semiconductor substrate 10.

In addition, in a case where the negative-type photoresist and an underlayer formed below the negative-type photoresist are collectively removed like a lift-off method, stripped pieces of a resist part which does not dissolve into the stripping solution are subdivided into particles, and they could contaminate the device structure. In the present example, however, the second photoresist pattern 58 and the first photoresist 50 are sequentially dissolved. Thereby, it is possible to prevent the stripped pieces from being subdivided into the particles, which lead to the contamination of the device structure, as compared with the case where the negative-type photoresist and the underlayer are collectively removed like the lift-off method.

Next, in step (i) of FIG. 2, a rear surface structure 108 is formed on the rear surface 104 of the semiconductor substrate 10. Thereby, the semiconductor device 100 is completed. The rear surface structure 108 includes, for example, the buffer layer 20, collector layer 72, cathode layer 74, and collector electrode 24 of FIG. 1. However, the constitution included in the rear surface structure 108 may be different, depending on the types of the semiconductor device 100. In FIG. 2, details of the rear surface structure 108 are omitted.

In the present example, a case has been described, in which a device including IGBT and a diode is manufactured as the semiconductor device 100, but the present invention is not limited to this case. The manufacturing method of the present example can also be applied in a case where the semiconductor device 100 which does not have the rear surface structure 108 is manufactured. In a case where the semiconductor device 100 which does not have the rear surface structure 108 is manufactured, step (i) of FIG. 2 is not necessary.

Figure 3:
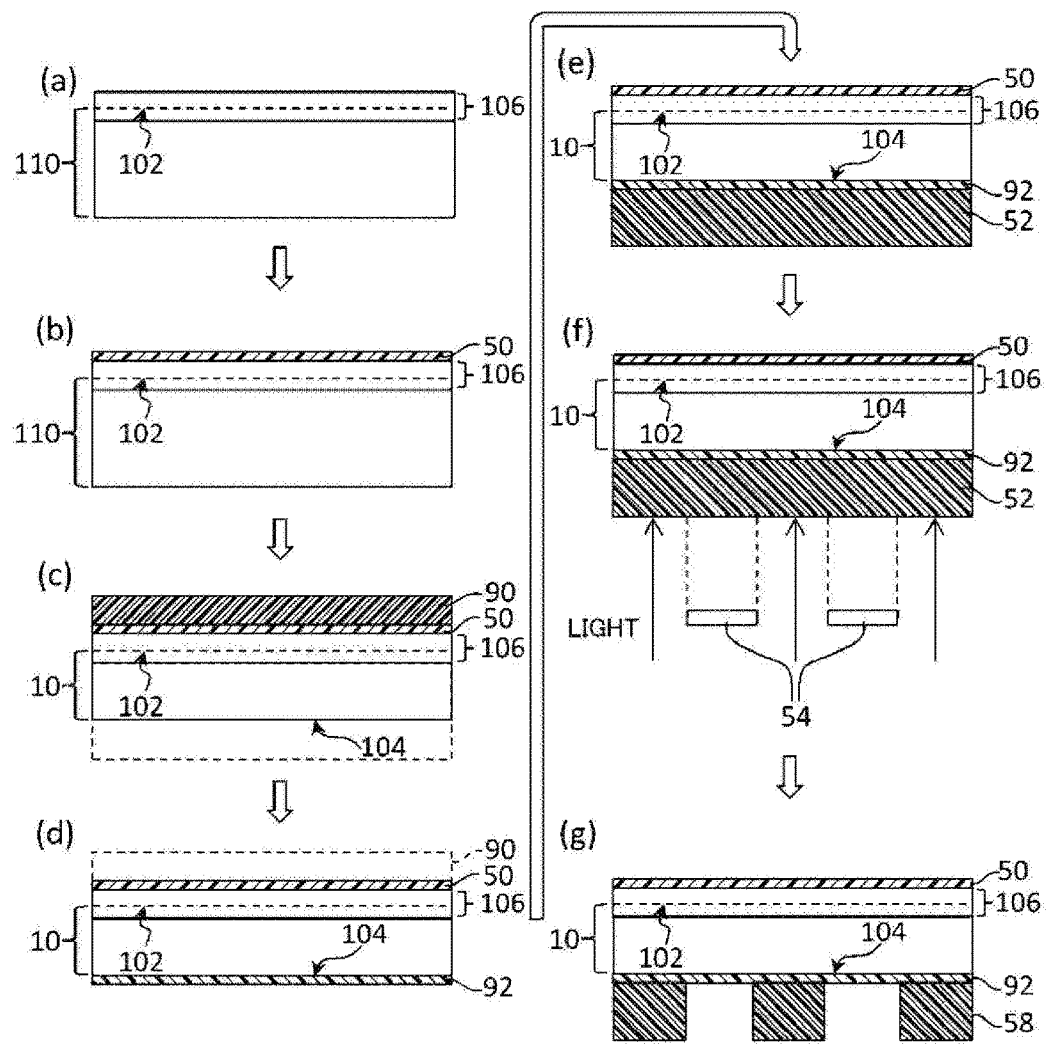
FIG. 3 is a cross-sectional schematic view illustrating a semiconductor device manufacturing process in a second embodiment.
Figure 4:
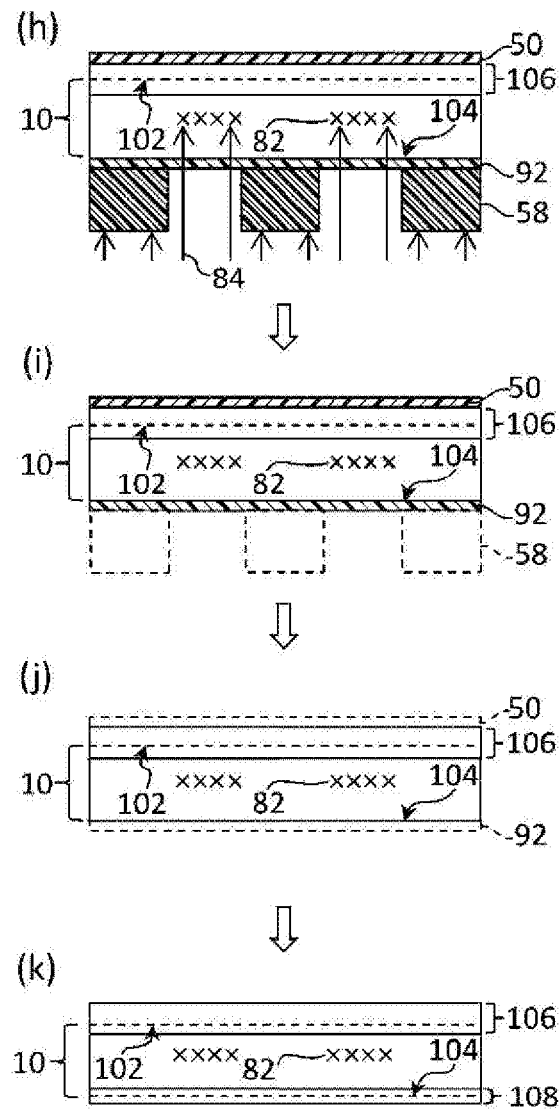
FIG. 4 is a cross-sectional schematic view illustrating a manufacturing process subsequent to FIG. 3.

FIG. 3 and FIG. 4 are cross-sectional schematic views illustrating the semiconductor device manufacturing process in the second embodiment. In step (a) of FIG. 3, a pre-polishing substrate 110 which is a semiconductor substrate prior to polishing is prepared. The front surface structure 106 is formed in the pre-polishing substrate 110. Next, in step (b) of FIG. 3, the first photoresist 50 is formed on the front surface 102. Step (a) of FIG. 3 and step (b) of FIG. 3 are the same as the case of the first embodiment described in step (a) of FIG. 2 and step (b) of FIG. 2, except for the use of the pre-polishing substrate 110 after polishing instead of the semiconductor substrate 10 after being polished, and thus a repetitive description will be omitted.

Next, in step (c) of FIG. 3, a protective film 90 is formed on the first photoresist 50. Thereby, the first photoresist 50 can be used as a base for the protective film 90. For that reason, the front surface structure 106 does not suffer damage when the protective film 90 is stripped. After the protective film 90 is formed, the rear surface of the pre-polishing substrate 110 is polished, and processed into the semiconductor substrate 10 having a predetermined thickness. The step of forming the protective film 90 and the step of polishing the rear surface of the pre-polishing substrate 110 are performed after the step of forming the foregoing first photoresist 50 (step (a) of FIG. 3), and before the step of forming the second photoresist 52 (step (e) of FIG. 3), which will be described later.

The polishing amount of the pre-polishing substrate 110 may be determined by target breakdown voltage of the semiconductor device 100. As described above, the polishing amount may be determined such that the thickness of the semiconductor substrate 10 after polishing is 60 µm or more and 120 µm or less.

The protective film 90 has a function of physically protecting the side of the front surface 102 of the semiconductor substrate 10. Materials of the protective film 90 may be polyethylene, polyethylene terephthalate, and polyimide. The thickness of the protective film 90 of the present example may be 10 µm or more and 200 µm or less.

In step (d) of FIG. 3, the protective film 90 is stripped. A third photoresist 92 is formed below the rear surface 104 of the semiconductor substrate 10. In the present example, the third photoresist 92 is the same positive-type photoresist as the first photoresist 50. The third photoresist 92 may be coated by the spin coating method. After being coated, the third photoresist 92 may be heat-cured as the pre-bake process.

The third photoresist 92 has a function of preventing damage on the rear surface 104 of the semiconductor substrate 10 caused when the impurities are implanted into the semiconductor substrate 10. However, the rear surface structure 108 of the semiconductor substrate 10 has not been yet formed at step (d) of FIG. 3, and thus, in a case where the damage of the rear surface 104 does not cause any problem, the formation of the third photoresist 92 may be omitted.

In step (e) of FIG. 3, the second photoresist 52 is formed below the rear surface 104 of the semiconductor substrate 10. In the present example, a third photoresist 92 is interposed between the rear surface 104 of the semiconductor substrate 10 and the second photoresist 52. In a case where the third photoresist 92 is not formed unlike the present example, the second photoresist 52 may be formed in contact with the rear surface 104 of the semiconductor substrate 10. The formation of the second photoresist 52 of the present example is similar to the case of the first embodiment except for the formation of the second photoresist 52 below the rear surface 104 of the semiconductor substrate 10, and thus a detailed description will be omitted.

By the exposure step in step (f) of FIG. 3 and the development step in step (g) of FIG. 3, the second photoresist 52 is subjected to patterning to form the second photoresist pattern 58 is formed. The exposure step in step (f) of FIG. 3 and the development step in step (g) of FIG. 3 are similar to the cases of the first embodiment, and thus a detailed description will be omitted.

Next, in step (h) of FIG. 4, the impurities 84 are implanted into the semiconductor substrate 10 using the second photoresist pattern 58 as a mask. In the present example, in the step of implanting the impurities, the impurities are implanted from the rear surface 104 of the semiconductor substrate 10. Therefore, the defect generation position can be controlled from the side of the rear surface 104. In particular, in a case where the impurities are implanted into a position close to the rear surface 104 of the semiconductor substrate 10, accelerating voltage at the time of implantation can be decreased when the impurities are implanted from the rear surface 104, as compared with the case where the impurities are implanted from the front surface 102. In the diode unit 80 of the present example, the impurities 84 injected from the ion implantation apparatus are implanted into the semiconductor substrate 10, penetrating the third photoresist 92.

In step (i) of FIG. 4, the second photoresist pattern 58 is removed after the step of implanting the impurities (step (h) of FIG. 4). Next, as shown in step (j) of FIG. 4, the first photoresist 50 is removed after the step of removing the second photoresist pattern 58 (step (i) of FIG. 4). In the present example, the first photoresist 50 and the third photoresist 92 are both positive-type photoresists. Therefore, in the present example, the first photoresist 50 and the third photoresist 92 are removed simultaneously.

The removal step of the second photoresist pattern 58 and the removal step of the first photoresist 50 are similar to those of the first embodiment shown in step (g) of FIG. 2 and step (h) of FIG. 2, except for removing the third photoresist 92 simultaneously. Therefore, a repetitive description will be omitted.

In step (k) of FIG. 4, the rear surface structure 108 is formed on the rear surface 104 of the semiconductor substrate 10. The formation step of the rear surface structure 108 is similar to the case of the first embodiment, and thus a repetitive description will be omitted.

Figure 5:
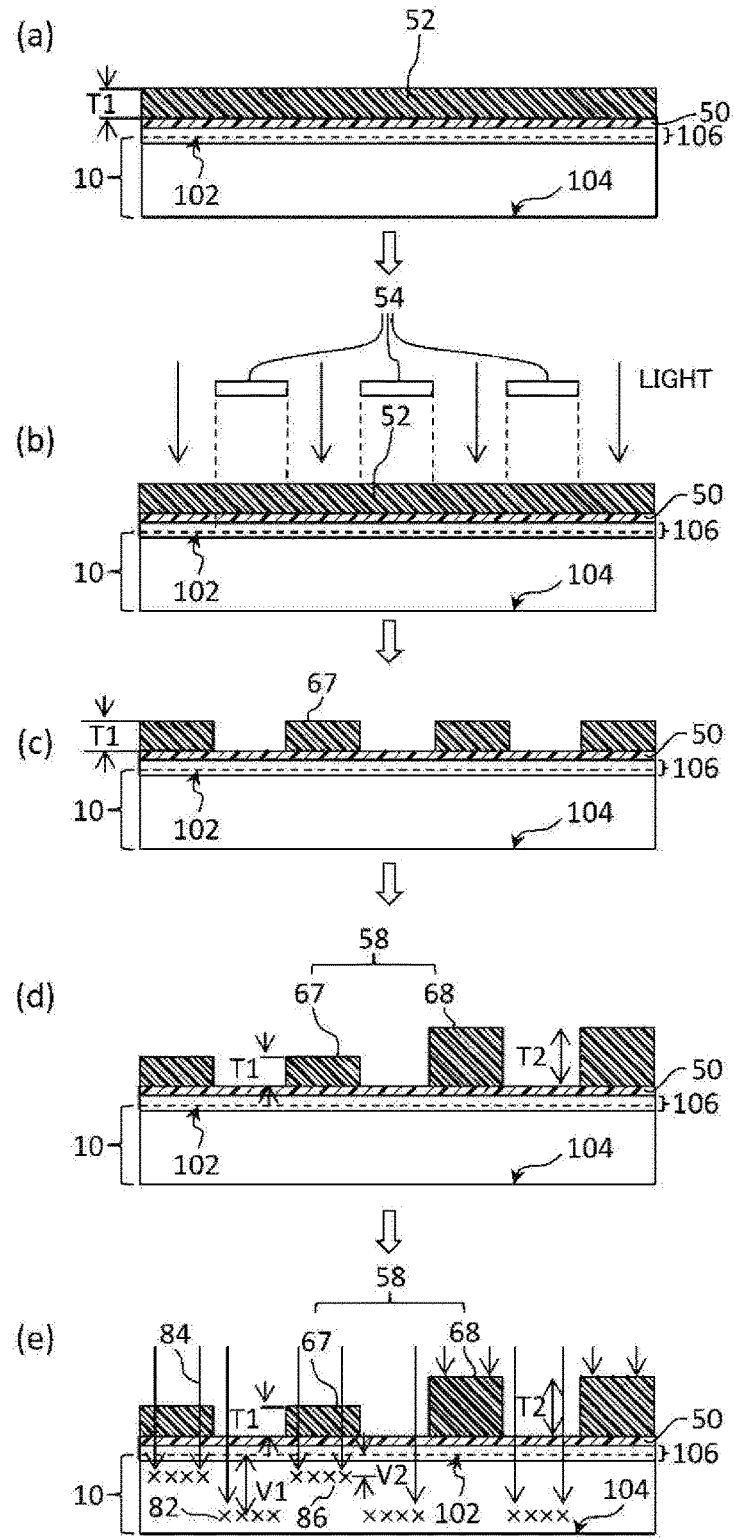
FIG. 5 is a cross-sectional schematic view illustrating a semiconductor device manufacturing process in a third embodiment.

FIG. 5 is a cross-sectional schematic view illustrating the semiconductor device manufacturing process in a third embodiment. The manufacturing process of the present example changes the impurity implantation depth according to a position of the semiconductor substrate 10. In the present example, in a position where first thickness T1 is provided for the crystal defect region 82 formed in the position of implantation depth V1, the impurities are implanted shallowly. Also, in a position where second thickness T2 is provided, the impurities are prevented from being implanted. The manufacturing process of the semiconductor device in the third embodiment is similar to that of the first and second embodiments except for the formation step of the second photoresist 52 and the implantation step of the impurities into the semiconductor substrate 10. Therefore, a repetitive description will be omitted.

In step (a) of FIG. 5, the second photoresist 52 is formed. The thickness of the second photoresist 52 has first thickness T1. By the exposure step in step (b) of FIG. 5 and the development step of step (c) of FIG. 5, the second photoresist 52 is subjected to patterning, and caused to have a first part pattern 67 having first thickness T1. By the resist discharge step of the ink jet method in step (d) of FIG. 5, resist is discharged on the first part pattern 67 by the ink jet method, and the second photoresist pattern 58 having different thicknesses depending on the regions is formed. The second photoresist pattern 58 has a first part pattern 67 having first thickness T1 and a second part pattern 68 having second thickness T2.

The second thickness T2 may be set to a thickness which is more than twice implantation depth V, similar to thickness D2 of the second photoresist 52 in the first embodiment. Thereby, it is possible to prevent the impurities from being implanted into the region where the impurity implantation is not necessary. First thickness T1 may be set such that the impurities are implanted into a predetermined implantation depth of the semiconductor substrate 10 via the first photoresist 50 and the first part pattern 67.

The materials of the second photoresist 52 and the resist discharged by the ink jet method may be the negative-type photoresist, and they may be similar to the materials of the first and second embodiments. The second photoresist 52 may be formed by the ink jet method. By changing the discharge amount of the resist according to the regions of the semiconductor substrate 10 by the ink jet method, it is possible to form the second photoresist pattern 58 having different thicknesses depending on the regions. Also, the second photoresist 52 may be the negative-type photosensitive dry film, and the second photoresist pattern 58 having first thickness T1 and second thickness T2 may be formed by discharging the resist on the photosensitive dry film by the ink jet method.

Next, in step (e) of FIG. 5, the impurities 84 are implanted into the semiconductor substrate 10 using the second photoresist pattern 58 as a mask. In a region where the second photoresist 52 is removed and the first photoresist 50 is exposed, the impurities 84 injected from the ion implantation apparatus are implanted into the semiconductor substrate 10, penetrating the first photoresist 50 and the front surface structure 106. Thereby, the crystal defect region 82 is formed in the position of implantation depth V1.

Also, the impurities 84 may be implanted into the semiconductor substrate 10 via the first photoresist 50 and the first part pattern 67 of the second photoresist pattern 58. More specifically, in a region where the first photoresist 50 and the first part pattern 67 are stacked, the impurities 84 injected from the ion implantation apparatus are implanted into the semiconductor substrate 10, penetrating the first part pattern 67, the first photoresist 50, and the front surface structure 106. Thereby, a second crystal defect region 86 is formed in the position of implantation depth V2. In this case, implantation depth V2 becomes shallower as compared with implantation depth V1, corresponding to a decrease in energy when the impurities 84 pass through the first part pattern 67.

Meanwhile, the implantation of the impurities 84 into the semiconductor substrate 10 is shielded via the first photoresist 50 and the second part pattern 68 of the second photoresist pattern 58. More specifically, in a region where the first photoresist 50 and the second part pattern 68 are stacked, the impurities 84 injected from the ion implantation apparatus is shielded from being implanted into the semiconductor substrate 10.

Figure 6:
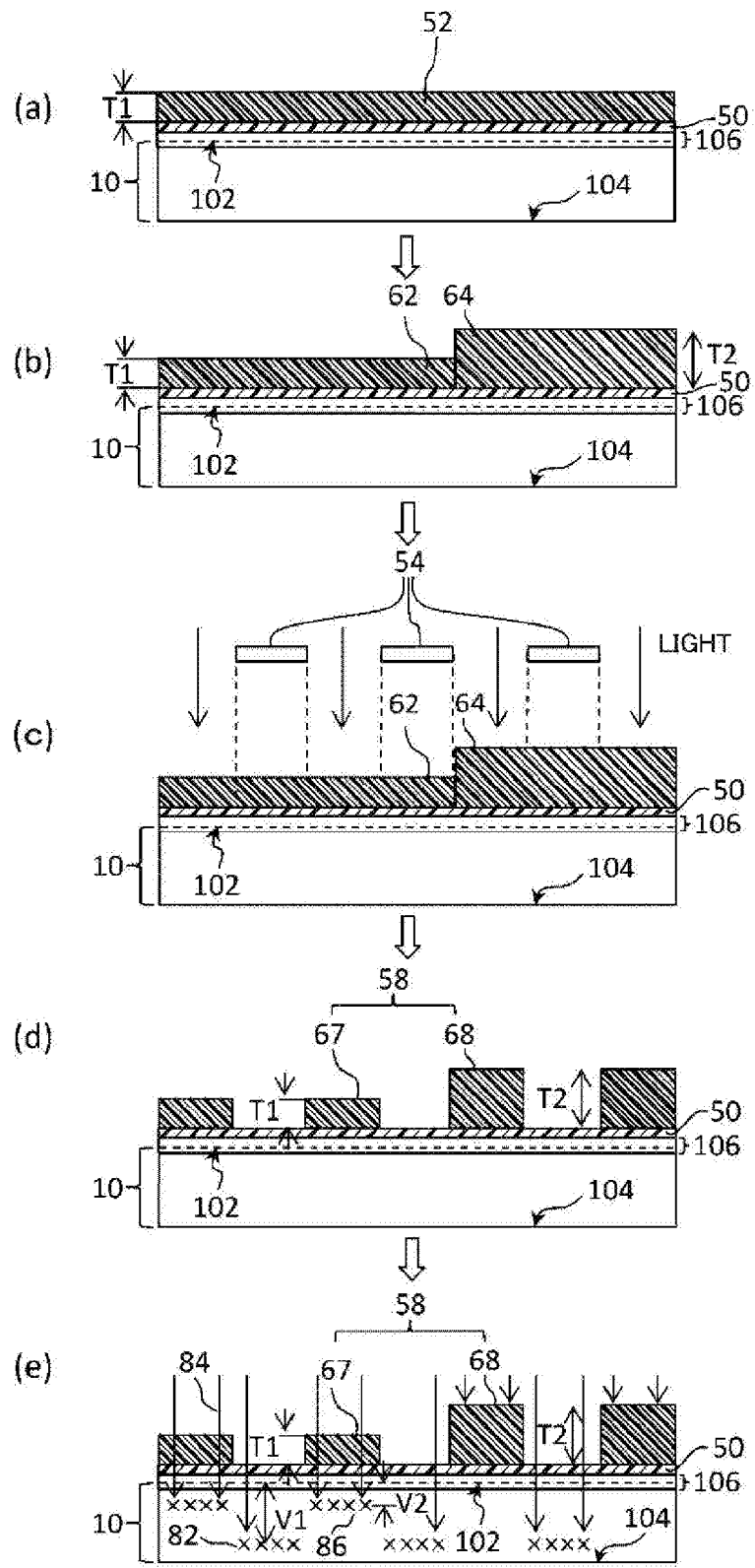
FIG. 6 is a cross-sectional schematic view illustrating a semiconductor device manufacturing process in a fourth embodiment.

FIG. 6 is a cross-sectional schematic view illustrating the semiconductor device manufacturing process in a fourth embodiment. The fourth embodiment is different from the third embodiment in providing a first part 62 having first thickness T1 and a second part 64 having second thickness T2 by discharging the resist on the second photoresist 52 by the ink jet method in step (b) of FIG. 6.

In step (a) of FIG. 6, the second photoresist 52 is formed. The thickness of the second photoresist 52 has first thickness T1. In both the first part 62 and the second part 64, unexposed parts of the second photoresist 52 are dissolved in the development step. In step (b) of FIG. 6, the resist is discharged on the second photoresist 52 by the ink jet method, and the first part 62 having first thickness T1 and the second part 64 having second thickness T2 are provided.

In the exposure step in step (c) of FIG. 6 and the development step in step (d) of FIG. 6, each of the first part pattern 67 and the second part pattern 68 is subjected to patterning simultaneously. The first part 62 is subjected to patterning to form the first part pattern 67, and the second part 64 is subjected to patterning to form the second part pattern 68.

Next, in step (e) of FIG. 6, the impurities 84 are implanted into the semiconductor substrate 10 using the second photoresist pattern 58 as a mask. In a region where the second photoresist 52 is removed and the first photoresist 50 is exposed, the impurities 84 injected from the ion implantation apparatus are implanted into the semiconductor substrate 10, penetrating the first photoresist 50 and the front surface structure 106. Thereby, the crystal defect region 82 is formed in the position of implantation depth V1. The semiconductor device manufacturing process in the fourth embodiment is the similar to that of the third embodiment except for the formation step of the second photoresist pattern 58. Therefore, a repetitive description will be omitted.

As mentioned above, according to the third embodiment and the fourth embodiment, the implantation depth of the impurities can be changed according to the position of the semiconductor substrate 10 without implanting the impurities by changing the accelerating voltage energy over plural times at the time of impurity implantation. The crystal defect region 82 at implantation depth V1 may be used as a field stop layer, while using the second crystal defect region 86 at implantation depth V2 as a lifetime killer.

In FIG. 5 and FIG. 6, a case has been described in which the impurities are implanted from the front surface 102 of the semiconductor substrate 10, similar to the first embodiment. However, the manufacturing method in the present embodiment may be applied in a case where the impurities are implanted from the rear surface 104 of the semiconductor substrate 10, similar to the second embodiment. In the present example, the second photoresist 52 was formed to have two thicknesses of T1 and T2. However, the present invention is not limited thereto, and the second photoresist 52 may be formed, dividing into regions having three or more different thicknesses.

In the first embodiment to the fourth embodiment, a case has been described as an example in which the first photoresist 50 is the positive-type photoresist and the second photoresist 52 is the negative-type photoresist. From the perspective of preventing the effects on the surface of the semiconductor device 100 at the time of removal of the photoresist, it is desirable that the first photoresist 50 is the positive-type photoresist and the second photoresist 52 is the negative-type photoresist. However, the present invention is not limited to the above. There may be a case where the first photoresist 50 is the negative-type photoresist and the second photoresist 52 is the positive-type photoresist. Thereby, the processing accuracy and alignment accuracy can also be improved as compared with the case where the metal mask is used.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10: semiconductor substrate, 12: emitter region, 14: base region, 16: contact region, 18: drift layer, 20: buffer layer: 24: collector electrode, 26: insulating layer, 28: emitter electrode, 30: passivation film, 32: opening, 42: insulating film, 44: gate electrode, 50: first photoresist, 52: second photoresist, 54: resist mask, 58: second photoresist pattern, 62: first part, 64: second part, 67: first part pattern, 68: second part pattern, 70: transistor unit, 72: collector layer, 74: cathode layer, 80: diode unit, 82: crystal defect region, 84: impurities, 86: second crystal defect region, 90: protective film, 92: third photoresist, 100: semiconductor device, 102: front surface, 104: rear surface, 106: front surface structure, 108: rear surface structure, 110: pre-polishing substrate

What is claimed is:

1. A method of manufacturing a semiconductor device, comprising:
forming a first photoresist layer on a front surface of a semiconductor substrate, the front surface being provided with a front surface structure, the first photoresist layer having a thickness which does not shield impurities;
forming, on the first photoresist layer, a second photoresist layer having opposite photo-curing properties from those of the first photoresist layer; and implanting impurities through the first photoresist layer into the semiconductor substrate using as a mask the second photoresist layer, which has been subjected to patterning;

wherein the first photoresist layer remains not patterned when the second photoresist layer is formed.

2. The method of manufacturing the semiconductor device according to claim 1, wherein photoresist of the first photoresist layer is a positive-type, and photoresist of the second photoresist layer is a negative-type.

3. The method of manufacturing the semiconductor device according to claim 1, wherein a thickness of the second photoresist layer is greater than a thickness of the first photoresist layer.

4. The method of manufacturing the semiconductor device according to claim 1, wherein photoresist of the second photoresist layer is a negative-type photosensitive dry film.

5. The method of manufacturing the semiconductor device according to claim 1, further comprising:

removing the second photoresist layer after the implantation of the impurities; and removing the first photoresist layer after the removal of the second photoresist layer.

6. The method of manufacturing the semiconductor device according to claim 1, wherein the impurities are implanted from the front surface of the semiconductor substrate.

7. The method of manufacturing the semiconductor device according to claim 6, wherein the second photoresist layer has a thickness which is more than twice an implantation depth of the impurities to be implanted into the semiconductor substrate.

8. The method of manufacturing the semiconductor device according to claim 1, wherein the second photoresist layer is formed below the rear surface of the semiconductor substrate in the formation of the second photoresist layer, and the impurities are implanted from the rear surface in the implantation of the impurities.

9. The method of manufacturing the semiconductor device according to claim 8, further comprising:

forming a protective film on the first photoresist layer; and polishing the rear surface of the semiconductor substrate, wherein the formation of the protective film and the polishing of the rear surface of the semiconductor substrate are performed after the formation of the first photoresist layer and before the formation of the second photoresist layer.

10. The method of manufacturing the semiconductor device according to claim 1, wherein a thickness of the second photoresist layer is greater than the thickness of the first photoresist layer.

11. The method of manufacturing the semiconductor device according to claim 1, wherein the first photoresist layer remains not patterned when the impurities are implanted.

* * * * *